United States Patent
Drago et al.

(10) Patent No.: US 11,626,531 B2
(45) Date of Patent: Apr. 11, 2023

(54) SEMICONDUCTOR BODY AND METHOD FOR PRODUCING A SEMICONDUCTOR BODY

(71) Applicant: OSRAM OLED GmbH, Regensburg (DE)

(72) Inventors: Massimo Drago, Riedenburg (DE); Alexander Frey, Lappersdorf (DE); Joachim Hertkorn, Woerth an der Donau (DE); Ingrid Koslow, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 154 days.

(21) Appl. No.: 16/643,463

(22) PCT Filed: Aug. 24, 2018

(86) PCT No.: PCT/EP2018/072906
§ 371 (c)(1),
(2) Date: Jul. 13, 2020

(87) PCT Pub. No.: WO2019/042894
PCT Pub. Date: Mar. 7, 2019

(65) Prior Publication Data
US 2020/0381579 A1    Dec. 3, 2020

(30) Foreign Application Priority Data
Sep. 4, 2017 (DE) .......... 102017120302.8

(51) Int. Cl.
*H01L 33/02* (2010.01)
*H01L 33/00* (2010.01)
*H01L 33/32* (2010.01)

(52) U.S. Cl.
CPC ........ *H01L 33/007* (2013.01); *H01L 33/0075* (2013.01); *H01L 33/025* (2013.01); *H01L 33/325* (2013.01)

(58) Field of Classification Search
CPC . H01L 33/007; H01L 33/0075; H01L 33/025; H01L 33/04; H01L 33/325
See application file for complete search history.

(56) References Cited

U.S. PATENT DOCUMENTS 6,337,493 B1    1/2002  Tanizawa et al.
2007/0290230 A1*  12/2007  Kawaguchi ......... H01S 5/34333
                                      257/E29.328
(Continued)

FOREIGN PATENT DOCUMENTS

CA    2322490 A1    9/1999
EP    1555697 A2    7/2005
(Continued)

OTHER PUBLICATIONS

Tongchang Zheng, et al., "High Mg effective incorporation in Al-rich AlxGa1-xN by periodic repetition of ultimate V/III ratio conditions," Nano Express Open Access, Nanoscale Research Letters, a SpringerOpen Journal, Zheng et al., http://www.nanoscalereslett.com/content/9/1/40, 2014, 7 pages.
(Continued)

*Primary Examiner* — Matthew C Landau
*Assistant Examiner* — Dmitriy Yemelyanov
(74) *Attorney, Agent, or Firm* — Slater Matsil, LLP

(57) ABSTRACT

A semiconductor body and a method for producing a semiconductor body are disclosed. In an embodiment a semiconductor body includes a p-conducting region, wherein the p-conducting region has at least one barrier zone and a contact zone, wherein the barrier zone has a first magnesium concentration and a first aluminum concentration, wherein
(Continued)

the contact zone has a second magnesium concentration and a second aluminum concentration, wherein the first aluminum concentration is greater than the second aluminum concentration, wherein the first magnesium concentration is at least ten times less than the second magnesium concentration, wherein the contact zone forms an outwardly exposed surface of the semiconductor body, and wherein the barrier zone adjoins the contact zone, and wherein the semiconductor body is based on a nitride compound semiconductor material.

15 Claims, 2 Drawing Sheets

(56) References Cited

U.S. PATENT DOCUMENTS

| 2008/0315243 | A1 | 12/2008 | Ueno et al. |
| 2010/0096616 | A1 | 4/2010 | Huang et al. |
| 2013/0099141 | A1* | 4/2013 | Chua ........................ H01L 33/26 438/47 |
| 2013/0306976 | A1 | 11/2013 | Haruta |
| 2014/0183446 | A1* | 7/2014 | Nago ...................... H01S 5/3013 438/37 |
| 2015/0263228 | A1* | 9/2015 | Lee ........................ H01L 33/325 257/76 |

FOREIGN PATENT DOCUMENTS

| EP | 1670106 A1 | 6/2006 |
| EP | 2988339 A2 | 2/2016 |
| JP | 2017117844 A * | 6/2017 |
| JP | 2017117844 A | 6/2017 |

OTHER PUBLICATIONS

Chang, Y. et al., "Study of Mg diffusion during metalorganic chemical vapor deposition of GaN and AlGaN," Appl. Phys. Lett. 74, 688 (1999); https://doi.org/10.1063/1.122988, Jan. 29, 1999, 14 pages.

* cited by examiner

SEMICONDUCTOR BODY AND METHOD FOR PRODUCING A SEMICONDUCTOR BODY

This patent application is a national phase filing under section 371 of PCT/EP2018/072906, filed Aug. 24, 2018, which claims the priority of German patent application 102017120302.8, filed Sep. 4, 2017, each of which is incorporated herein by reference in its entirety.

TECHNICAL FIELD

A semiconductor body is specified. Furthermore, a method for producing a semiconductor body is specified.

SUMMARY OF THE INVENTION

Embodiments provide a semiconductor body having improved electrical and/or optical properties. Further embodiments provide a method for producing such a semiconductor body.

The semiconductor body is, for example, a semiconductor body of an optoelectronic semiconductor chip or of an electronic semiconductor chip. In particular, the semiconductor body can be configured to detect or to emit electromagnetic radiation during operation as intended. By way of example, the semiconductor body is configured to generate electromagnetic radiation in the visible wavelength range, between the infrared wavelength range and the wavelength range of UV radiation, during operation as intended.

In accordance with at least one embodiment, the semiconductor body is based on a nitride compound semiconductor material comprising a p-conducting region. In particular, the nitride compound semiconductor material is a III-V semiconductor formed with gallium and nitrogen, for example. The semiconductor body has a p-conducting region, in which the nitride compound semiconductor material is p-doped. By way of example, the semiconductor body is p-doped by means of magnesium.

Furthermore, the semiconductor body can have an n-doped region, in which the nitride compound semiconductor material is n-doped. Byway of example, an active region is arranged between the p-conducting region and the n-conducting region, in which active region, during operation as intended, the function of the semiconductor body is implemented, for example electromagnetic radiation is able to be generated.

In accordance with at least one embodiment, the p-conducting region has a barrier zone and a contact zone. In particular, the barrier zone and the contact zone are part of the p-conducting region. By way of example, the barrier zone and the contact zone are arranged next to one another in the growth direction of the semiconductor body. By way of example, the barrier zone and the contact zone each extend over the entire cross-sectional area of the semiconductor body in the main plane of extent of the semiconductor body. By way of example, the contact zone and the barrier zone are produced in successive process steps of a common production process. The barrier zone and the contact zone can each be formed with nitride compound semiconductor material comprising identical materials from the third and fifth main groups.

In accordance with at least one embodiment, the barrier zone has a first magnesium concentration and a first aluminum concentration. In particular, the first magnesium concentration and the first aluminum concentration are in each case an average concentration of magnesium atoms and aluminum atoms within the barrier zone. In particular, the aluminum atoms are part of the nitride compound semiconductor material with which the semiconductor body is formed. The magnesium atoms can be a p-type dopant, by means of the concentration of which in the semiconductor body the p-type conductivity of the nitride compound semiconductor material is able to be set. In the present case, substance concentrations denote the concentration of a substance in the semiconductor body.

In accordance with at least one embodiment, the contact zone has a second magnesium concentration and a second aluminum concentration. In particular, the second magnesium concentration and the second aluminum concentration are in each case an average concentration of magnesium atoms and aluminum atoms within the contact zone.

In accordance with at least one embodiment, the first aluminum concentration is greater than the second aluminum concentration. By way of example, the first aluminum concentration is at least ten times, in particular at least one hundred times, greater than the second aluminum concentration.

In accordance with at least one embodiment, the first magnesium concentration is less than the second magnesium concentration. In particular, the first magnesium concentration is at least ten times, in particular at least one hundred times, less than the second magnesium concentration.

In accordance with at least one embodiment, the contact zone forms an outwardly exposed surface of the semiconductor body. In particular, the contact zone forms a main surface of the semiconductor body, via which the semiconductor body is electrically conductively contactable.

In accordance with at least one embodiment, the barrier zone adjoins the contact zone. In particular, the barrier zone and the contact zone are in direct mechanical contact with one another at the side of the contact zone facing away from the outwardly exposed surface. By way of example, the barrier zone and the contact zone are cohesively mechanically fixedly connected to one another, such that the mechanical connection between the barrier zone and the contact zone is releasable only with destruction of the barrier zone and/or the contact zone. In particular, the barrier zone and the contact zone are electrically conductively connected to one another.

In accordance with at least one embodiment, the semiconductor body is based on a nitride compound semiconductor material comprising a p-conducting region. The p-conducting region has a barrier zone and a contact zone, wherein the barrier zone has a first magnesium concentration and a first aluminum concentration, the contact zone has a second magnesium concentration and a second aluminum concentration, the first aluminum concentration is greater than the second aluminum concentration, the first magnesium concentration is less than the second magnesium concentration, the contact zone forms an outwardly exposed surface of the semiconductor body, and the barrier zone adjoins the contact zone.

A semiconductor body described here is based in this case on the following considerations, inter alia. The p-conducting region of a semiconductor body based on a nitride compound semiconductor material is grown epitaxially, for example. In order to achieve a low contact resistance between the p-conducting region of the semiconductor body and an adjoining metallization formed with silver or nickel, for example, the semiconductor material is particularly heavily p-doped in the region in which the semiconductor body adjoins the metallization. By way of example, the nitride compound semiconductor material is p-doped by means of magnesium.

The high magnesium doping results in increased light absorption and an increased roughness of the semiconductor body, and makes it difficult to control the magnesium concentration in regions of the semiconductor body that adjoin the contact zone, since the magnesium diffuses within the semiconductor body. Furthermore, particularly thick layers having a high magnesium concentration can have a reduced concentration of acceptor atoms, as a result of which the conductivity and the ohmic contact are impaired. Furthermore, regions of the semiconductor body having a high magnesium concentration can result in magnesium inclusions and inversion regions, as a result of which the external quantum efficiency of a light-emitting semiconductor chip can be impaired. These negative influences are intensified in particular by a large thickness of the magnesium-doped layer.

The semiconductor body described here makes use then of the concept, inter alia, of increasing the aluminum concentration in the p-conducting region, in regions, and thus influencing the distribution of the magnesium atoms within the p-conducting region. This exploits the fact, inter alia, that magnesium atoms have a lower solubility in an aluminum-containing semiconductor material such as aluminum gallium nitride (AlGaN) than in a semiconductor material comprising less or no aluminum, such as gallium nitride (GaN). Consequently, during the epitaxial growth of aluminum gallium nitride, for example, only a low magnesium concentration is incorporated into the semiconductor body, even if a high magnesium fraction is provided during the epitaxial growth. Furthermore, the zone with aluminum gallium nitride, for example, forms a barrier zone, by means of which the diffusion of magnesium atoms within the p-conducting region is reduced. If a high magnesium fraction is provided during the epitaxial growth of the barrier zone, then the magnesium atoms are firstly added to the surface of the semiconductor body. If the aluminum concentration is reduced, then there is an increase in the solubility of the magnesium atoms within the p-conducting region, such that the magnesium atoms added during the growth of the barrier zone can be incorporated into the semiconductor body with high concentration in a particularly thin contact zone. In the present case, a substance fraction describes a fraction of a substance in a gas phase which fills during the epitaxial growth in the process chamber in which the semiconductor body is deposited.

Advantageously, the barrier zone enables a particularly thin contact zone having a particularly high magnesium concentration, as a result of which the semiconductor body has a particularly high transparency and a particularly low electrical contact resistance.

In accordance with at least one embodiment, the semiconductor body is based on a nitride compound semiconductor material and comprises a p-conducting region. The p-conducting region has a barrier zone and a contact zone, wherein the barrier zone comprises a semiconductor material of the fifth main group and a semiconductor material of the third main group in a first ratio. Furthermore, the contact zone comprises a semiconductor material of the fifth main group and a semiconductor material of the third main group in a second ratio. In this case, the first ratio is less than the second ratio.

Here and hereinafter "semiconductor material of the third main group" of the barrier zone encompasses all materials of the third main group which are present in the barrier zone.

Here and hereinafter "semiconductor material of the fifth main group" of the barrier zone encompasses all materials of the fifth main group which are present in the barrier zone. Here and hereinafter "semiconductor material of the third main group" of the contact zone encompasses all materials of the third main group which are present in the contact zone. Here and hereinafter "semiconductor material of the fifth main group" of the contact zone encompasses all materials of the fifth main group which are present in the contact zone.

By way of example, the gas phase surrounding the semiconductor body has a smaller nitrogen fraction during the production of the barrier zone than during the production of the contact zone. Furthermore, the gas phase surrounding the semiconductor body can have a greater gallium concentration during the production of the barrier zone than during the production of the contact zone. This advantageously makes it possible, during the growth of the barrier zone, to add a particularly large amount of magnesium atoms to the surface of the semiconductor body. Furthermore, this makes it possible, during the growth of the contact zone, to incorporate a particularly large amount of magnesium atoms into the semiconductor body.

In accordance with at least one embodiment, the second magnesium concentration is at least $0.5 \times 10^{19}$ atoms/cm$^3$. In particular, the second magnesium concentration is at least $1 \times 10^{20}$ atoms/cm$^3$. By way of example, the second magnesium concentration is on average at least $0.5 \times 1019$ atoms/cm$^3$. In particular, the second magnesium concentration rises from $0.5 \times 10^{19}$ atoms/cm$^3$ to at least $1 \times 10^{20}$ atoms/cm$^3$ in the growth direction of the semiconductor body. In particular, the semiconductor body has at least a magnesium concentration of $1 \times 10^{20}$ atoms/cm$^3$ in a region adjoining an outwardly exposed surface. A high second magnesium concentration advantageously enables a particularly low electrical resistance when the semiconductor body is electrically contacted.

Byway of example, the maximum rate of change of the magnesium concentration along the growth direction of the semiconductor body upon the transition from the barrier zone to the contact zone is at least $\pm 1 \times 10^{20}$ atoms/cm$^3$ per µm, preferably at least $\pm 1 \times 10^{21}$ atoms/cm$^3$ per µm.

In accordance with at least one embodiment, the contact zone has a thickness of at least 0.5 nm inclusive and a maximum of 100 nm inclusive perpendicular to its main plane of extent. In particular, the contact zone has a thickness of at least 0.5 nm inclusive and a maximum of 20 nm inclusive perpendicular to its main plane of extent. In particular, the thickness is measured along the growth direction of the semiconductor body. The contact zone advantageously has a particularly small thickness, such that only a small proportion of the electromagnetic radiation passing through the contact zone is absorbed in the contact zone.

In accordance with at least one embodiment, the semiconductor body has a larger band gap in the barrier zone than in the contact zone. In particular, the contact zone has a lower resistivity than the barrier zone. Advantageously such a contact zone is electrically conductively contactable particularly well.

In accordance with at least one embodiment, the first aluminum concentration is between $4.4 \times 10^{19}$ atoms/cm$^3$ and $1.8 \times 10^{22}$ atoms/cm$^3$ inclusive. This corresponds to an alloy comprising between 0.1% and 40% aluminum. In particular, the first aluminum concentration can be between $4.4 \times 10^2$ atoms/cm$^3$ and $1.8 \times 10^{22}$ atoms/cm$^3$ inclusive. This corresponds to an alloy comprising between 1% and 40% aluminum. By way of example, the aluminum concentration within the barrier zone firstly increases in the growth direction until it has a maximum value, and subsequently decreases again in the growth direction. Such a first aluminum concentration advantageously makes it possible to restrict the diffusion of magnesium within the semiconductor body.

In accordance with at least one embodiment, the contact zone is nominally free of aluminum. In particular, the second aluminum concentration is a maximum of $1 \times 10^{18}$ atoms/cm$^3$. A particularly low aluminum concentration within the contact zone advantageously enables a particularly high solubility of magnesium atoms within the contact zone, such that the contact zone has a particularly high conductivity.

Furthermore, a method for producing a semiconductor body is specified. In particular, a semiconductor body described here can be produced by the method. That is to say that all features disclosed for the semiconductor body are also disclosed for the method, and vice versa.

In accordance with at least one embodiment of the method for producing a semiconductor body based on a nitride compound semiconductor material, a p-conducting region comprising at least one barrier zone and a contact zone is grown epitaxially. The barrier zone is grown during a first time period and the contact zone is grown during a second time period, wherein the second time period chronologically follows the first time period, and a first aluminum fraction is provided during the first time period and a second aluminum fraction is provided during the second time period. In this case, the first aluminum fraction is greater than the second aluminum fraction.

The nitride compound semiconductor material is gallium nitride, for example. Apart from the p-conducting region, an n-conducting region and an active region can additionally be grown epitaxially. In particular, the barrier zone is arranged between the contact zone and the active region. In this case, it is possible for the barrier zone to directly adjoin the contact zone and the active region or for further layers, for example, an electron blocking layer, to be arranged between the barrier zone and at least one of the two components mentioned.

By way of example, the contact zone on a side facing away from the active zone forms an outer surface of the semiconductor body. The semiconductor body is electrically conductively contactable, for example, via the contact zone.

By way of example, the second time period directly follows the first time period. Consequently, the barrier zone and contact zone grown in successive time periods adjoin one another directly. In particular, the barrier zone and the contact zone are cohesively fixedly connected to one another. The barrier zone, for example, can be configured, in the finished semiconductor body, to reduce the diffusion and the incorporation of p-type dopant within the semiconductor body.

In order to carry out the epitaxy method, for example, a growth substrate can be provided, on which the nitride compound semiconductor material is deposited epitaxially. The growth substrate is arranged in a process chamber, for example, into which various materials are able to be introduced in gaseous and/or liquid form. Depending on what concentration of a material is intended to be attained in the semiconductor body to be grown, the supplied gas and/or the supplied liquid comprise(s) different fractions of different materials. By way of example, the supplied gas and/or the supplied liquid have/has a first and a second magnesium fraction and/or a first and a second aluminum fraction during different time periods.

In accordance with at least one embodiment of the method, a first magnesium fraction is provided during the first time period and a second magnesium fraction is provided during the second time period. Furthermore, during the first time period the barrier zone is grown with a first magnesium concentration and during the second time period the contact zone is grown with a second magnesium concentration. In this case, the second magnesium concentration is greater than the first magnesium concentration. By way of example, in the method, it is possible to control the different magnesium concentrations in the barrier zone and the contact zone by means of providing different magnesium fractions during the first time period and during the second time period. Furthermore, it is possible to control the different magnesium concentrations in the barrier zone and in the contact zone by means of providing different aluminum fractions during the first and second time periods. Advantageously, it is thus possible to achieve a particularly high magnesium concentration within the contact zone, such that the contact zone has a particularly high conductivity.

In accordance with at least one embodiment, the first magnesium fraction is at least exactly equal in magnitude to the second magnesium fraction. By way of example, a magnesium fraction provided during the first time period is exactly equal in magnitude to that provided during the second time period. In particular, the incorporation of magnesium atoms is then controlled by means of providing different aluminum fractions during the first and second time periods.

Advantageously, as a result of providing a high first aluminum fraction, the solubility of magnesium atoms is reduced, such that during the first time period at least one portion of the first magnesium fraction provided is added to the surface of the semiconductor body. A smaller aluminum fraction is then provided during the second time period than during the first time period, such that the solubility of magnesium atoms in the semiconductor body is increased. Consequently, in the course of epitaxial growth during the second time period a portion of the magnesium atoms that were added to the surface during the first time period and the second magnesium fraction provided are incorporated into the semiconductor body. Advantageously, therefore, with identical first and second magnesium fractions, a different first and second magnesium concentration in the semiconductor body is achieved.

In accordance with at least one embodiment, an amount of magnesium added to a surface of the semiconductor body facing away from the growth substrate is greater during the first time period than during the second time period. By way of example, the composition of the nitride compound semiconductor material which is grown during the first time period has a lower solubility for magnesium within the nitride compound semiconductor material than the nitride compound semiconductor material which is grown epitaxially during the second time period. Consequently, by means of providing an increased first aluminum fraction and an increased first magnesium fraction during the first time period, it is possible to form a magnesium reservoir at the surface of the semiconductor body. In a subsequent method step, in which a smaller aluminum fraction is provided during the second time period than during the first time period, wherein the aluminum fraction can be zero during the second time period, magnesium for incorporation into the semiconductor body is thus already available at the surface of the semiconductor body. It is thus possible to increase the magnesium concentration in the growth direction of the semiconductor body with a particularly high rate of change.

Furthermore, the barrier zone functions as a diffusion barrier in the finished semiconductor body, diffusion of magnesium atoms within the semiconductor body being reduced by means of the diffusion barrier. Advantageously, therefore, the barrier zone enables magnesium to be enriched during production, such that it is possible to produce a particularly high magnesium concentration within the semiconductor body, and the barrier zone additionally enables a contact zone adjoining the barrier zone to be produced, wherein the contact zone has a particularly high magnesium concentration.

In accordance with at least one embodiment, during the first time period the first aluminum fraction provided is continuously increased and then continuously reduced. By way of example, in the p-conducting region, in particular in the barrier zone, the aluminum fraction rises continuously along the growth direction until it reaches a maximum value, and subsequently falls continuously. Advantageously, therefore, the band gap in the p-conducting region does not change abruptly along the growth direction, with the result that the p-conducting region has a particularly low electrical resistance.

In accordance with at least one embodiment, a growth rate of the semiconductor body is higher during the first time period than during the second time period. By way of example, the growth rate during the first time period is at least 15 nm/min. In particular, the growth rate during the second time period is a maximum of 4 nm/min. Advantageously, a particularly low growth rate during the second time period enables a particularly high magnesium concentration within the contact zone.

In accordance with at least one embodiment, the contact zone is nominally free of aluminum. By way of example, no aluminum is provided during the second time period. Advantageously, a contact zone that is nominally free of aluminum enables a particularly high magnesium concentration within the contact zone.

In accordance with at least one embodiment of the method, during the first time period a semiconductor material from the fifth main group and a semiconductor material of the third main group are provided in a first ratio. During the second time period the semiconductor material from the fifth main group and the semiconductor material from the third main group are provided in a second ratio. In this case, the first ratio is less than the second ratio. By way of example, nitrogen (N) in the form of ammonia ($NH_3$) and gallium in the form of trimethylgallium, ($Ga(CH_3)_3$), are provided. In particular, the nitrogen-to-gallium ratio with which nitrogen and gallium are provided during the first time period is a maximum of 500:1. In particular, the nitrogen-to-gallium ratio with which nitrogen and gallium are provided during the second time period is at least 5000:1.

In particular, the semiconductor body has a lower nitrogen concentration within the barrier zone than in the contact zone. Furthermore, the semiconductor body can have a greater gallium concentration within the barrier zone than in the contact zone. Advantageously, during the growth of the barrier zone, this makes it possible to add a particularly large amount of magnesium atoms to the surface of the semiconductor body. Furthermore, during the growth of the contact zone, this makes it possible to incorporate a particularly large amount of magnesium atoms into the semiconductor body.

Moreover, a further method for producing a semiconductor body is specified. In particular, a semiconductor body described here can be produced by the method. That is to say that all features disclosed for the semiconductor body are also disclosed for the method, and vice versa.

In accordance with at least one embodiment of the method, during the first time period a semiconductor material from the fifth main group and a semiconductor material of the third main group are provided in a first ratio. During the second time period, the semiconductor material from the fifth main group and the semiconductor material from the third main group are provided in a second ratio. In this case, the first ratio is less than the second ratio. By way of example, nitrogen (N) in the form of ammonia ($NH_3$) and gallium in the form of trimethylgallium, ($Ga(CH_3)_3$), are provided. In particular, the nitrogen-to-gallium ratio with which nitrogen and gallium are provided during the first time period is a maximum of 500:1. In particular, the nitrogen-to-gallium ratio with which nitrogen and gallium are provided during the second time period is at least 5000:1.

Such a method can be used to produce, in particular, a semiconductor body based on a nitride compound semiconductor material comprising a p-conducting region having a barrier zone and a contact zone, wherein the barrier zone comprises a semiconductor material of the fifth main group and a semiconductor material of the third main group in a first ratio, and the contact zone comprises a semiconductor material of the fifth main group and a semiconductor material of the third main group in a second ratio. In this case, the first ratio is, in particular, less than the second ratio.

BRIEF DESCRIPTION OF THE DRAWINGS

Further advantages and advantageous configurations and developments of the semiconductor body and of the method for producing a semiconductor body will become apparent from the following exemplary embodiments illustrated in association with the figures.

In the figures.

Elements that are identical, of identical type or act identically are provided with the same reference signs in the figures. The figures and the size relationships of the elements illustrated in the figures among one another should not be regarded as to scale. Rather, individual elements may be illustrated with exaggerated size in order to enable better illustration and/or for a better understanding.

DETAILED DESCRIPTION OF ILLUSTRATIVE EMBODIMENTS

Figure 1:
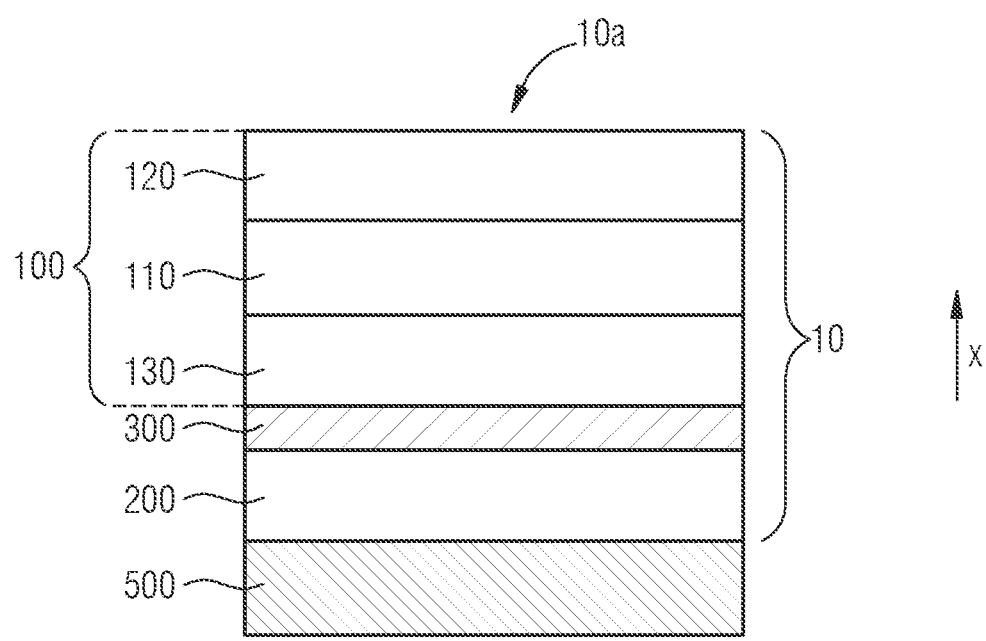
FIG. 1 shows a schematic sectional illustration of one exemplary embodiment of a semiconductor body described here.

FIG. 1 shows a schematic sectional illustration of one exemplary embodiment of a semiconductor body 10 described here. The semiconductor body 10 is arranged on a growth substrate 500. In particular, the semiconductor body 10 is produced on the growth substrate 500. The semiconductor body 10 is based on a nitride compound semiconductor material and comprises a p-conducting region 100, an n-conducting region 200 and an active region 300. The active region 300 is arranged between the n-conducting region 200 and the p-conducting region 100 in the growth direction X. In particular, the p-conducting region 100, the n-conducting region 200 and the active region 300 are produced by means of an epitaxy method. The n-conducting region 200, the active region 300 and the p-conducting region 100 are cohesively mechanically fixedly connected to one another. The p-conducting region 100 is arranged on a side of the active region 300 facing away from the growth substrate 500.

The p-conducting region 100 comprises a barrier zone 110 and a contact zone 120. In this case, the barrier zone 110 has a first magnesium concentration M110 and a first aluminum concentration A110. The contact zone 120 has a second magnesium concentration M120 and a second aluminum concentration A120. The first aluminum concentration A110 is greater than the second aluminum concentration A120. The first magnesium concentration M110 is less than the second magnesium concentration M120. The first magnesium concentration M110 is a maximum of $2\times10^{19}$ atoms/cm$^3$, for example. In particular, the second magnesium concentration M120 is at least $0.5\times10^{19}$ atoms/cm$^3$, in particular at least $1\times10^{20}$ atoms/cm$^3$. The first aluminum concentration A110 is at least $4.4\times10^{20}$ atoms/cm$^3$, for example. In particular, the second aluminum concentration A120 is a maximum of $4.4\times10^{18}$ atoms/cm$^3$.

The contact zone forms an outwardly exposed surface 10a of the semiconductor body 10 and the barrier zone 110 adjoins the contact zone 120. In particular, the contact zone forms a main surface of the semiconductor body 10. In the growth direction X, the contact zone has a thickness of at least 0.5 nm inclusive and a maximum of 100 nm inclusive. In particular, the contact zone 120 is nominally free of aluminum.

Figure 2:
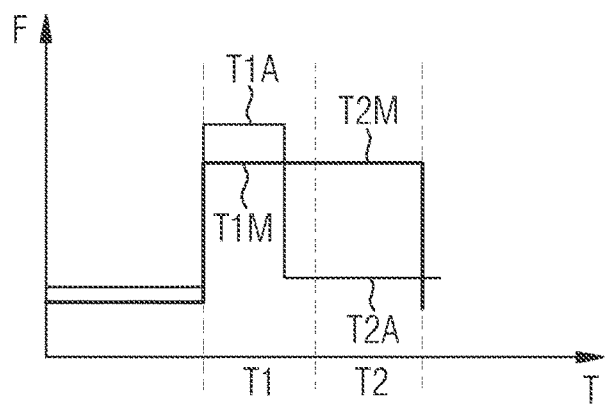
FIG. 2 shows a graph illustrating the fractions of magnesium and aluminum provided during a first time period and a second time period of one exemplary embodiment of a method for producing a semiconductor body as described here.

FIG. 2 shows a graph illustrating aluminum fractions and magnesium fractions provided during the epitaxial production of the semiconductor body 10 in accordance with one exemplary embodiment. In accordance with this exemplary embodiment of the method for producing a semiconductor body 10 based on a nitride compound semiconductor material, a p-conducting region 100 comprising at least one barrier zone 110 and a contact zone 120 is grown epitaxially. The barrier zone 110 is grown during a first time period T1 and the contact zone 120 is grown during a second time period T2. The second time period T2 chronologically follows the first time period T1. A first aluminum fraction T1A is provided during the first time period T1. A second aluminum fraction T2A is provided during the second time period. In this case, the first aluminum fraction T1A is greater than the second aluminum fraction T2A.

The first aluminum fraction T1A and the second aluminum fraction T2A are provided, for example, by means of different flow rates of an aluminum-containing gas. By way of example, the first and second aluminum fractions are provided together with hydrogen or nitrogen provided as carrier gas. Byway of example, during the first time period T1, the aluminum-containing gas is provided at a flow rate of at least 400 sccm. Furthermore, during the second time period T2, the second aluminum fraction T2A is provided at a flow rate of a maximum of 50 sccm.

A first magnesium fraction T1M is provided during the first time period T1 and a second magnesium fraction T2M is provided during the second time period T2. During the first time period T1, the barrier zone 110 is grown with a first magnesium concentration M110. During the second time period T2, the contact zone 120 is grown with a second magnesium concentration M120. By way of example, during the first and/or second time period T1, a magnesium-containing gas is provided at a flow rate of between 50 sccm and 500 sccm inclusive.

The first magnesium fraction T1M is at least exactly equal in magnitude to the second magnesium fraction T2M. In particular, the first magnesium fraction T1M and the second magnesium fraction T2M are equal in magnitude. The magnesium fractions are not necessarily illustrated relative to the aluminum fractions in this graph.

In particular, the growth rate of the semiconductor body 10 is higher during the first time period T1 than during the second time period T2. Furthermore, during the first time period T1 a semiconductor material from the fifth main group and a semiconductor material from the third main group can be provided in a first ratio R1. In this case, the first ratio R1 describes the proportion of the provided semiconductor material from the fifth main group relative to the proportion of the provided semiconductor material from the third main group during the first time period T1. By way of example, during the first time period, nitrogen and gallium are provided in a first ratio R1. During the second time period T2, the semiconductor material from the fifth main group and the semiconductor material from the third main group are provided in a second ratio R2. In this case, the second ratio R2 describes the proportion of the provided semiconductor material from the fifth main group relative to the proportion of the provided semiconductor material from the third main group during the second time period T2. In particular, nitrogen and gallium are provided in a second ratio R2. In this case, the first ratio R1 is less than the second ratio R2. In other words, relative to the amount of gallium provided, a smaller amount of nitrogen is provided during the first time period T1 than during the second time period. By way of example, the nitrogen-to-gallium ratio provided during the first time period T1 is 500:1, and that provided during the second time period T2 is 5000:1.

Figure 3:
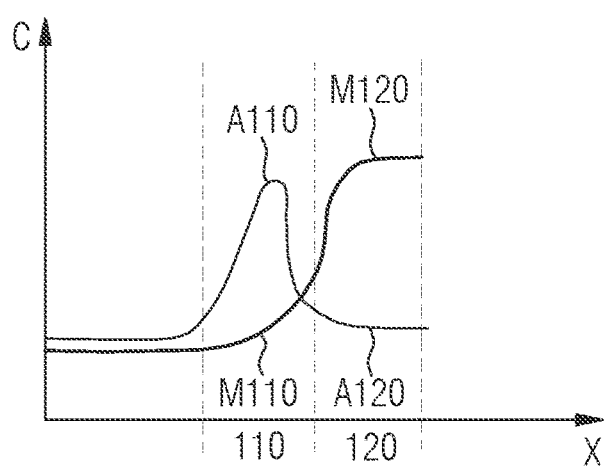
FIG. 3 shows a graph illustrating the concentrations of aluminum and magnesium along the growth direction in the contact zone and in the barrier zone of one exemplary embodiment of a semiconductor body described here.

FIG. 3 shows a graph illustrating the aluminum and magnesium concentration C along the growth direction X in the barrier zone 110 and the contact zone 120 in accordance with one exemplary embodiment. The first aluminum concentration A110 of the barrier zone 110 is greater than the second aluminum concentration A120 of the contact zone 120. Furthermore, the first magnesium concentration M110 of the barrier zone is less than the second magnesium concentration M120 of the contact zone 120. In particular, the barrier zone serves as a diffusion barrier for the magnesium atoms in the contact zone 120, such that the magnesium in the contact zone 120 does not diffuse in the direction of the barrier zone 10 within the p-conducting region 100.

Figure 4:
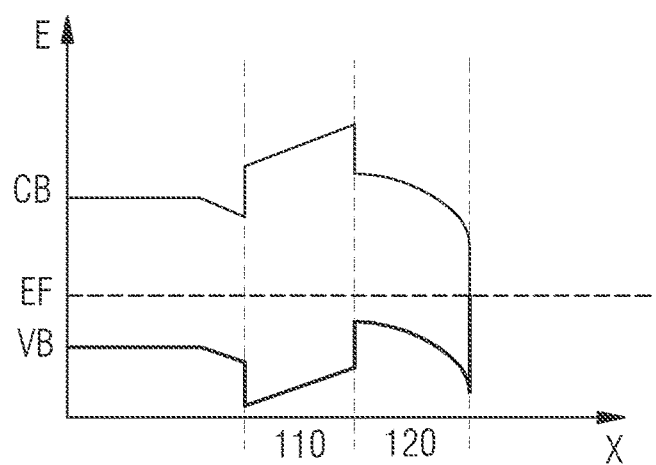
FIG. 4 shows a graph illustrating the minimum energy of the conduction band, the maximum energy of the valence band and the Fermi level along the growth direction in the barrier zone and in the contact zone of one exemplary embodiment of a semiconductor body described here.

FIG. 4 shows a graph illustrating the energy states E along the growth direction X of the semiconductor body 10 in accordance with one exemplary embodiment. The semiconductor material has a lowest energy state of the conduction band CB which varies along the growth direction X. Furthermore, the semiconductor body 10 has a highest energy state of the valence band VB which varies along the growth direction X of the semiconductor body 10. The Fermi level EF of the semiconductor body 10 runs in a range lying energetically between the lowest energy state of the conduction band CB and the highest energy state of the valence band VB. The semiconductor body 10 has a larger band gap between the lowest energy state of the conduction band CB and the highest energy state of the valence band VB in the barrier zone 110 than in the contact zone 120. In particular, the contact resistance between the contact zone 120 and a metallization arranged on the contact zone 120 is lower than the contact resistance between a metallization and the barrier zone 110.

The invention is not restricted to the exemplary embodiments by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A semiconductor body comprising:
a p-conducting region having at least one barrier zone and a contact zone,
wherein the barrier zone has a first magnesium concentration and a first aluminum concentration, the first magnesium concentration and the first aluminum concentration being larger than zero,
wherein the contact zone has a second magnesium concentration and a second aluminum concentration, the second magnesium concentration and the second aluminum concentration being larger than zero,
wherein the first aluminum concentration is greater than the second aluminum concentration,
wherein the first magnesium concentration is at least ten times less than the second magnesium concentration,
wherein the contact zone forms an outwardly exposed surface of the semiconductor body,
wherein the barrier zone adjoins the contact zone,
wherein the semiconductor body is based on a nitride compound semiconductor material, and
wherein a rate of change of a magnesium concentration along a growth direction of the semiconductor body upon a transition from the barrier zone to the contact zone is at least $\pm 1 \times 10^{20}$ atoms/cm$^3$ per µm.

2. The semiconductor body of claim 1, wherein the first aluminum concentration is between $4.4 \times 10^{19}$ atoms/cm$^3$ and $1.8 \times 10^{22}$ atoms/cm$^3$ inclusive.

3. The semiconductor body of claim 1, wherein the second magnesium concentration is between $0.5 \times 10^{19}$ atoms/cm$^3$ and $1 \times 10^{20}$ atoms/cm$^3$ inclusive.

4. The semiconductor body of claim 1, wherein the contact zone has a thickness of between 0.5 nm and 100 nm inclusive perpendicular to its main plane of extension.

5. The semiconductor body of claim 1, wherein the contact zone has a thickness of between 0.5 nm and 20 nm inclusive perpendicular to its main plane of extension.

6. The semiconductor body of claim 1, wherein the semiconductor body has a larger band gap in the barrier zone than in the contact zone.

7. The semiconductor body of claim 1, wherein the first aluminum concentration within the barrier zone firstly increases in a growth direction until it has a maximum value, and subsequently decreases again in the growth direction.

8. A semiconductor body comprising:
a p-conducting region having a barrier zone and a contact zone,
wherein the barrier zone comprises a semiconductor material of the fifth main group and a semiconductor material of the third main group in a first ratio,
wherein the contact zone comprises a semiconductor material of the fifth main group and a semiconductor material of the third main group in a second ratio,
wherein the first ratio is less than the second ratio,
wherein the semiconductor body is based on a nitride compound semiconductor material, and
wherein a rate of change of a magnesium concentration along a growth direction of the semiconductor body upon a transition from the barrier zone to the contact zone is at least $\pm 1 \times 10^{20}$ atoms/cm$^3$ per µm.

9. The semiconductor body of claim 8, wherein the barrier zone has a first magnesium concentration and the contact zone has a second magnesium concentration.

10. The semiconductor body of claim 9, wherein the second magnesium concentration is at least $0.5 \times 10^{19}$ atoms/cm$^3$.

11. The semiconductor body of claim 8, wherein the semiconductor body has a larger band gap in the barrier zone than in the contact zone.

12. The semiconductor body of claim 8, wherein the contact zone is nominally free of aluminum.

13. The semiconductor body of claim 12, wherein the barrier zone has a first aluminum concentration is between $4.4 \times 10^{19}$ atoms/cm$^3$ and $1.8 \times 10^{22}$ atoms/cm$^3$ inclusive.

14. The semiconductor body of claim 8, wherein the contact zone has a thickness of between 0.5 nm and 20 nm inclusive perpendicular to its main plane of extension.

15. A semiconductor body comprising:
a p-conducting region having at least one barrier zone and a contact zone,
wherein the barrier zone has a first magnesium concentration and a first aluminum concentration,
wherein the contact zone has a second magnesium concentration and a second aluminum concentration,
wherein the first aluminum concentration is greater than the second aluminum concentration,
wherein the first magnesium concentration is at least ten times less than the second magnesium concentration,
wherein the contact zone forms an outwardly exposed surface of the semiconductor body,
wherein the barrier zone adjoins the contact zone,
wherein a rate of change of a magnesium concentration along a growth direction of the semiconductor body upon a transition from the barrier zone to the contact zone is at least $\pm 1 \times 10^{20}$ atoms/cm$^3$ per µm, and
wherein the semiconductor body is based on a nitride compound semiconductor material.

* * * * *